(12) United States Patent
Li

(10) Patent No.: US 10,871,678 B2
(45) Date of Patent: Dec. 22, 2020

(54) COLOR FILTER SUBSTRATE, FABRICATING METHOD THEREOF, DISPLAY PANEL AND DISPLAY DEVICE

(71) Applicants: BOE TECHNOLOGY GROUP CO., LTD., Beijing (CN); FUZHOU BOE OPTOELECTRONICS TECHNOLOGY CO., LTD., Fujian (CN)

(72) Inventor: Dahai Li, Beijing (CN)

(73) Assignees: BOE TECHNOLOGY GROUP CO., LTD., Beijing (CN); FUZHOU BOE OPTOELECTRONICS TECHNOLOGY CO., LTD., Fujian (CN)

(*) Notice: Subject to any disclaimer, the term of this patent is extended or adjusted under 35 U.S.C. 154(b) by 90 days.

(21) Appl. No.: 15/928,371

(22) Filed: Mar. 22, 2018

(65) Prior Publication Data
US 2019/0056625 A1 Feb. 21, 2019

(30) Foreign Application Priority Data

Aug. 18, 2017 (CN) .......................... 2017 1 0712249

(51) Int. Cl.
*G02F 1/1335* (2006.01)
*G02F 1/13357* (2006.01)
(Continued)

(52) U.S. Cl.
CPC ....... *G02F 1/133617* (2013.01); *B41M 3/003* (2013.01); *G02F 1/133516* (2013.01);
(Continued)

(58) Field of Classification Search
CPC ............. G02F 1/1335; G02F 1/133617; G02F 1/133514; G02F 1/133512;
(Continued)

(56) References Cited

U.S. PATENT DOCUMENTS

2003/0113639 A1 6/2003 Kawase
2005/0225574 A1 10/2005 Brown Elliott et al.
(Continued)

FOREIGN PATENT DOCUMENTS

CN 1427271 A 7/2003
CN 1722193 A 1/2006
(Continued)

OTHER PUBLICATIONS

First Office Action for Chinese Application No. 201710712249.9, dated Sep. 4, 2019, 8 Pages.

*Primary Examiner* — Audrey Y Chang
(74) *Attorney, Agent, or Firm* — Brooks Kushman P.C.

(57) ABSTRACT

A method for fabricating a color filter substrate is provided according to embodiments of the present disclosure. The method includes: forming a strip-like first black matrix pattern on a base substrate of the color filter substrate, where the first black matrix pattern defines a first pixel region and a second pixel region alternately arranged in a first direction, the first direction is perpendicular to an extending direction of the first black matrix pattern, and a first width of the first pixel region in the first direction is larger than a second width of the second pixel region in the first direction; fabricating a color resistance layer or a light-transmissive layer in the first pixel region through an inkjet printing process; and fabricating a color resistance layer or a light-transmissive layer in the second pixel region through an exposure and development process.

14 Claims, 5 Drawing Sheets

(51) Int. Cl.
*B41M 3/00* (2006.01)
*G03F 7/16* (2006.01)
*G03F 7/00* (2006.01)

(52) U.S. Cl.
CPC .......... *G03F 7/16* (2013.01); *G02F 1/133512* (2013.01); *G03F 7/0007* (2013.01)

(58) Field of Classification Search
CPC ..... G02F 1/133516; G02F 2001/13622; H01L 27/3216; H01L 27/3211; G03F 7/16
USPC ............................ 349/106, 61, 694, 108, 109
See application file for complete search history.

(56) References Cited

U.S. PATENT DOCUMENTS

| 2007/0064020 | A1* | 3/2007 | Credelle | G09G 3/2003 345/694 |
|---|---|---|---|---|
| 2008/0231681 | A1 | 9/2008 | Chen et al. | |
| 2009/0033842 | A1* | 2/2009 | Yu | G02F 1/136209 349/106 |
| 2012/0075737 | A1 | 3/2012 | Ohkawara et al. | |
| 2013/0161595 | A1* | 6/2013 | Kim | H01L 27/3216 257/40 |
| 2015/0286097 | A1* | 10/2015 | Lee | G02F 1/133617 349/61 |
| 2016/0085102 | A1 | 3/2016 | Ohmuro et al. | |
| 2016/0351843 | A1* | 12/2016 | Yang | H01L 27/3211 |

FOREIGN PATENT DOCUMENTS

| CN | 202600174 U | 12/2012 |
|---|---|---|
| CN | 105378517 A | 3/2016 |
| CN | 107024794 A | 8/2017 |
| JP | H089404 A | 1/1996 |
| TW | 200839370 A | 10/2008 |

\* cited by examiner

COLOR FILTER SUBSTRATE, FABRICATING METHOD THEREOF, DISPLAY PANEL AND DISPLAY DEVICE

CROSS-REFERENCE TO RELATED APPLICATION

This application claims priority to Chinese Patent Application No. 201710712249.9 filed on Aug. 18, 2017, which is incorporated herein by reference in its entirety.

TECHNICAL FIELD

The present disclosure relates to the field of display technologies, in particular to a color filter substrate, a fabricating method thereof, a display panel and a display device.

BACKGROUND

In a color filter substrate fabricating process in the related art, a grid-like black matrix pattern is formed on a base substrate of a color filter substrate, each grid is a sub-pixel region, and color filter units of three colors which are R (red), G (green) and B (blue) are respectively formed on the adjacent sub-pixel regions by coating, exposing and developing three times. However, in such a manner, an offset or an angle offset may occur between sub-pixels, which may result in poor display.

With the progress of process technologies, a method for preparing color filter units by an inkjet printing method is proposed. Specifically, in the inkjet printing method, pigment with R/G/B three colors is directly and precisely sprayed in the pre-formed grid-like black matrix pattern in the corresponding sub-pixel regions by using a high-precision inkjet printing process, and the color filter units are formed after the pigment is solidified. For the inkjet printing method, the cost is relatively low, the process is relatively simple, a color resistance utilization rate is high, but the requirement for spraying precision is pretty demanding.

SUMMARY

In a first aspect, a method for fabricating a color filter substrate is provided according to embodiments of the present disclosure. The method includes:

forming a strip-like first black matrix pattern on a base substrate of the color filter substrate, where the first black matrix pattern defines a first pixel region and a second pixel region alternately arranged in a first direction, the first direction is perpendicular to an extending direction of the first black matrix pattern, and a first width of the first pixel region in the first direction is larger than a second width of the second pixel region in the first direction;

fabricating a color resistance layer or a light-transmissive layer in the first pixel region through an inkjet printing process; and fabricating a color resistance layer or a light-transmissive layer in the second pixel region through an exposure and development process.

In an optional embodiment of the present disclosure, the fabricating the color resistance layer in the first pixel region through the inkjet printing process includes:

spraying a color resistance material in the first pixel region through the inkjet printing process to fabricate the color resistance layer, where the color resistance material includes at least one of a color filter material, a fluorescent material and a quantum dot material.

In an optional embodiment of the present disclosure, first color sub-pixels, second color sub-pixels and third color sub-pixels are formed on the color filter substrate, a first color, a second color and a third color are capable of mixing into a white color, and the fabricating method further includes:

fabricating the color resistance layer of the second color sub-pixels in the second pixel region; and fabricating the color resistance layer of the first color sub-pixels and the color resistance layer of the third color sub-pixels in the first pixel region, where the first color sub-pixels and the third color sub-pixels are alternately arranged in the first direction in the first pixel region.

In an optional embodiment of the present disclosure, the first color sub-pixels, the second color sub-pixels and the third color sub-pixels are formed on the color filter substrate, the first color, the second color and the third color are capable of mixing into a white color, and the fabricating method further includes:

fabricating the color resistance layer of the first color sub-pixels and the color resistance layer of the third color sub-pixels in the second pixel region, where the first color sub-pixels and the third color sub-pixels are alternately arranged in the first direction in the second pixel region; and fabricating the color resistance layer of the second color sub-pixels in the first pixel region.

In an optional embodiment of the present disclosure, after fabricating the color resistance layer or the light-transmissive layer in the first pixel region through the inkjet printing process and fabricating the color resistance layer or the light-transmissive layer in the second pixel region through the exposure and development process, the fabricating method further includes:

forming a planarization layer; and forming a mesh-like second black matrix pattern on the planarization layer, where a plurality of sub-pixel regions are defined by the second black matrix pattern.

In an optional embodiment of the present disclosure, after fabricating the color resistance layer or the light-transmissive layer in the second pixel region through the exposure and development process, the fabricating method further includes:

forming a planarization layer; and forming a strip-like second black matrix pattern on the planarization layer, where the second black matrix pattern extends in a second direction perpendicular to the first direction, and a plurality of sub-pixel regions are defined by the first black matrix pattern and the second black matrix pattern.

In an optional embodiment of the present disclosure, the first width is twice of the second width.

In an optional embodiment of the present disclosure, the first width is larger than twice of the second width.

In a second aspect, a color filter substrate is further provided according to the embodiments of the present disclosure. The color filter substrate includes: a base substrate; and a strip-like first black matrix pattern on the base substrate, where the first black matrix pattern defines a first pixel region and a second pixel region arranged alternately in a first direction, the first direction is perpendicular to an extending direction of the first black matrix pattern, a first width of the first pixel region in the first direction is larger than a second width of the second pixel region in the first direction, a color resistance layer or a light-transmissive layer is arranged in the first pixel region, and a color resistance layer or a light-transmissive layer is arranged in the second pixel region.

In an optional embodiment of the present disclosure, the first width is larger than twice of the second width.

In an optional embodiment of the present disclosure, first color sub-pixels, second color sub-pixels and third color sub-pixels are formed on the color filter substrate, a first color, a second color and a third color are capable of mixing into a white color, the second color sub-pixels is arranged in the second pixel region, and the first color sub-pixels and the third color sub-pixels are arranged alternately in the first direction in the first pixel region.

In an optional embodiment of the present disclosure, the first color sub-pixels, the second color sub-pixels and the third color sub-pixels are formed on the color filter substrate, the first color, the second color and the third color are capable of mixing into a white color, the second color sub-pixels is arranged in the first pixel region, and the first color sub-pixels and the third color sub-pixels are arranged alternately in the first direction in the second pixel region.

In an optional embodiment of the present disclosure, the second color sub-pixels are blue sub-pixels, the first color sub-pixels are red sub-pixels, the third color sub-pixels are green sub-pixels, the second color sub-pixels includes a light-transmissive layer or a blue quantum dot layer in the second pixel region, the first color sub-pixels includes a red quantum dot layer in the first pixel region, and the third color sub-pixels includes a green quantum dot layer in the first pixel region.

In an optional embodiment of the present disclosure, the color filter substrate further includes: a planarization layer covering the color resistance layer or the light-transmissive layer; and a mesh-like second black matrix pattern on the planarization layer, where a plurality of sub-pixel regions are defined by the second black matrix pattern.

In an optional embodiment of the present disclosure, the color filter substrate further includes: a planarization layer covering the color resistance layer or the light-transmissive layer; and a strip-like second black matrix pattern on the planarization layer, where the second black matrix pattern extends in a second direction perpendicular to the first direction, and a plurality of sub-pixel regions are defined by the first black matrix pattern and the second black matrix pattern.

In a third aspect, a display panel is further provided according to the embodiments of the present disclosure, which includes the above color filter substrate.

In a fourth aspect, a display device is further provided according to the embodiments of the present disclosure, which includes the above display panel and a backlight source located at a light-emitting side of the display panel.

In an optional embodiment of the present disclosure, the backlight source is a monochromatic backlight source in a case that a light-transmissive layer is arranged in the first pixel region or the second pixel region.

In an optional embodiment of the present disclosure, the color filter substrate includes a plurality of blue sub-pixels, a plurality of red sub-pixels and a plurality of green sub-pixels, each of the blue sub-pixels includes a light-transmissive layer in the second pixel region, each of the red sub-pixels includes a red quantum dot layer in the first pixel region, each of the green sub-pixels includes green quantum dot layer in the first pixel region, and the backlight source is a blue backlight source.

| Reference numbers: | | | |
|---|---|---|---|
| 1 | first black matrix pattern | 2 | red color resistance layer |
| 3 | blue color resistance layer | 4 | green color resistance layer |
| 5 | second black matrix pattern | 6 | green quantum dot layer |
| 7 | red quantum dot layer | 8 | blue backlight source |
| 9 | light-transmissive layer | | |

DETAILED DESCRIPTION

To make technical problems to be solved, technical solutions and advantages of embodiments of the present disclosure clearer, hereinafter the specific embodiments will be described in detail in conjunction with drawings.

In the related art, color filter units are fabricated through an exposure and development process, which causes an offset or an angle offset to be formed between sub-pixels, thereby resulting in poor display, or the color filter units are fabricated by an inkjet printing method, which has a high requirement on a spraying precision. To solve the above problems, the embodiments of the present disclosure provide a color filter substrate, a fabricating method thereof, a display panel and a display device, so as to reduce a precision requirement of the inkjet printing method applied to fabricate the color resistance layer, and avoid the poor display caused by the offset or the angle offset formed between the sub-pixels.

Figure 1:
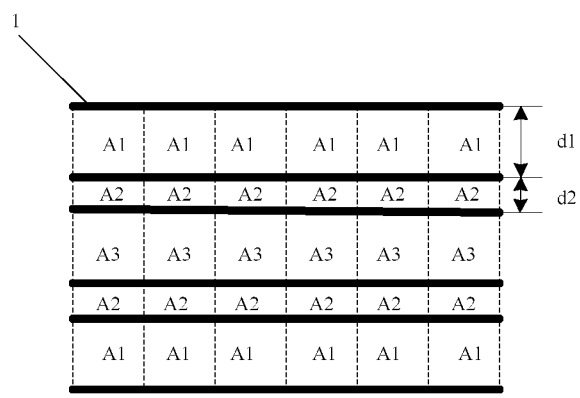
FIG. 1 is a schematic diagram of a color filter substrate according to an embodiment of the present disclosure.

A method for fabricating a color filter substrate is provided according to an embodiment of the present disclosure. As shown in FIG. 1, the method includes:

forming a strip-like first black matrix pattern 1 on a base substrate, where the first black matrix pattern 1 defines a first pixel region (A1 and A3) and a second pixel region (A2) alternately arranged in a first direction, the first direction is perpendicular to an extending direction of the first black matrix pattern, and a first width d1 of the first pixel region in the first direction is larger than a second width d2 of the second pixel region in the first direction;

fabricating a color resistance layer or a light-transmissive layer in the first pixel region through an inkjet printing process; and fabricating a color resistance layer or a light-transmissive layer in the second pixel region through an exposure and development process.

In the embodiment, two kinds of pixel regions with different widths are formed on the color filter substrate, and the two kinds of pixel regions with different widths are alternately arranged on the color filter substrate. The color resistance layer is fabricated in the wide pixel region through the inkjet printing process, which may reduce the precision requirement of the inkjet printing method applied to fabricate the color resistance layer, improve reliability of a color-film substrate product, enable the inkjet printing method to be applied to more kinds of color filter substrate products with different sizes, and take advantages of the inkjet printing method, such as the low cost, simple process and high color resistance utilization. In addition, the color resistance layer or the light-transmissive layer is fabricated through the exposure and development process in the narrow pixel region. Since the narrow pixel region and the wide pixel region are alternately arranged on the color filter substrate, and the adjacent narrow pixel regions are spaced by the wide pixel region, it is able to prevent an offset or an angle offset from forming between the color resistance layer or the light-transmissive layer fabricated through the exposure and development process, to avoid adverse effects, and to ensure display effect of the display device.

As shown in Figures, d1 may be exactly twice of d2, or larger than twice of d2. In such a manner, the first pixel region is wider, which may reduce the precision requirement of the inkjet printing method applied to fabricate the color resistance layer.

Further, the fabricating the color resistance layer in the first pixel region through the inkjet printing process includes: spraying a color resistance material in the first pixel region through the inkjet printing process to fabricate the color resistance layer, where the color resistance material includes at least one of a color filter material, a fluorescent material and a quantum dot material.

Specifically, the fabricating the color resistance layer in the second pixel region through the exposure and development process includes: coating a color resistance material on the base substrate; and exposing and developing the color resistance material to form the color resistance layer in the second pixel region. The color resistance material includes at least one of a color filter material, a fluorescent material and a quantum dot material. However, the embodiments of the present disclosure are not limited thereto.

The fabricating the light-transmissive layer in the second pixel region through the exposure and development process includes: coating a light-transmissive material on the base substrate; and exposing and developing the light-transmissive material to form the light-transmissive layer in the second pixel region.

When the light-transmissive layer is formed in the first pixel region or the second pixel region, a backlight source of the corresponding display device is a monochromatic backlight source. In such a manner, the monochromatic light emitted by the monochromatic backlight source may be emitted directly through the light-transmissive layer and participate in the color display.

Further, first color sub-pixels, second color sub-pixels and third color sub-pixels are formed on the color filter substrate, a first color, a second color and a third color are capable of mixing into a white color, and the fabricating method specifically includes:

fabricating the color resistance layer or the light-transmissive layer of the second color sub-pixels in the second pixel region;

fabricating the color resistance layer of the first color sub-pixels and the color resistance layer of the third color sub-pixels in the first pixel region, where the first color sub-pixels and the third color sub-pixels are alternately arranged in the first direction in the first pixel region, such that the first color sub-pixels, the second color sub-pixels and the third color sub-pixels are alternately arranged to achieve the color display, or fabricating the color resistance layer of the first color sub-pixels and the color resistance layer of the third color sub-pixels in the second pixel region, where the first color sub-pixels and the third color sub-pixels are alternately arranged in the first direction in the second pixel region; and fabricating the color resistance layer or the light-transmissive layer of the second color sub-pixels in the first pixel region.

Figure 2:
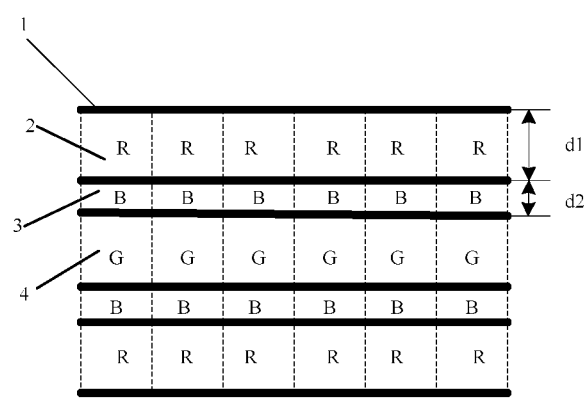
FIG. 2 is a schematic diagram of a color filter substrate according to another embodiment of the present disclosure.

In a specific embodiment, as shown in FIG. 2, a red color resistance layer 2 and a green color resistance layer 4 are formed in the first pixel region through the inkjet printing process, which are alternately arranged; and a blue color resistance layer 3 is formed in the second pixel region through the exposure and development process. In a case that the red color resistance layer 2, the green color resistance layer 4 and the blue color resistance layer 3 are made of a color filter material, the backlight source of the corresponding display device is a white backlight source. In a case that the red color resistance layer 2, the green color resistance layer 4 and the blue color resistance layer 3 are made of a quantum dot material, the backlight source of the corresponding display device is a blue backlight source.

Figure 3:
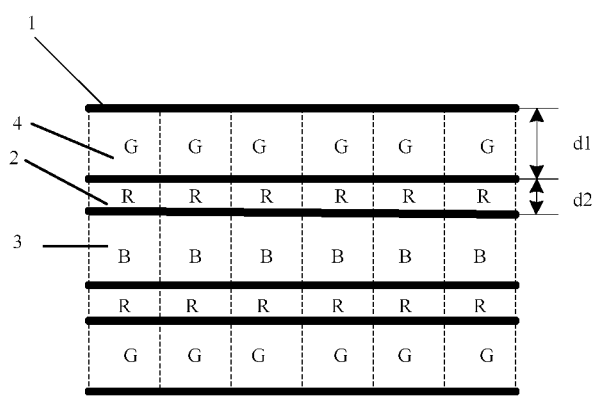
FIG. 3 is a schematic diagram of a color filter substrate according to another embodiment of the present disclosure.

In another specific embodiment, as shown in FIG. 3, a blue color resistance layer 3 and a green color resistance layer 4 are formed in the first pixel region through the inkjet printing process, which are alternately arranged; and a red color resistance layer 2 is formed in the second pixel region through the exposure and development process. In a case that the red color resistance layer 2, the green color resistance layer 4 and the blue color resistance layer 3 are made of a color filter material, the backlight source of the corresponding display device is a white backlight source. In a case that the red color resistance layer 2, the green color resistance layer 4 and the blue color resistance layer 3 are made of a quantum dot material, the backlight source of the corresponding display device is a blue backlight source.

Figure 4:
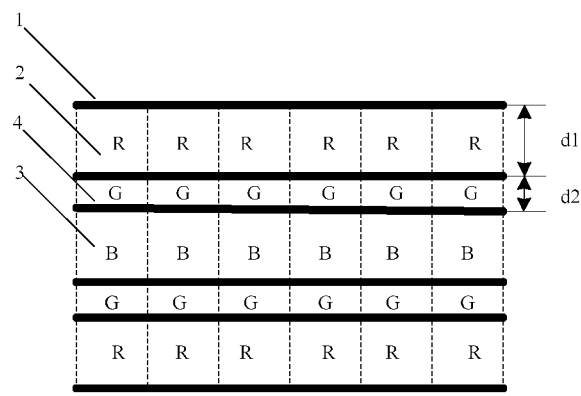
FIG. 4 is a schematic diagram of a color filter substrate according to another embodiment of the present disclosure.

In another specific embodiment, as shown in FIG. 4, a blue color resistance layer 3 and a red color resistance layer 2 are formed in the first pixel region through the inkjet printing process, which are alternately arranged; and a green color resistance layer 4 is formed in the second pixel region through the exposure and development process. In a case that the red color resistance layer 2, the green color resistance layer 4 and the blue color resistance layer 3 are made of a color filter material, the backlight source of the corresponding display device is a white backlight source. In a case that the red color resistance layer 2, the green color resistance layer 4 and the blue color resistance layer 3 are made of a quantum dot material, the backlight source of the corresponding display device is a blue backlight source.

Figure 5:
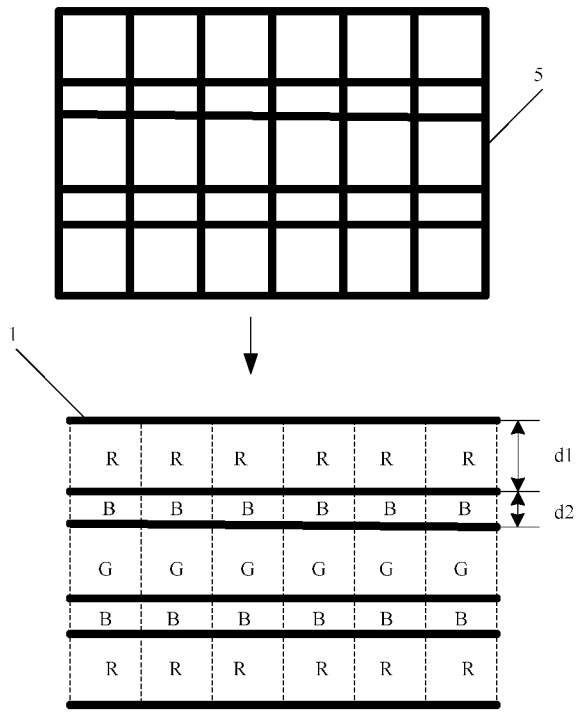
FIG. 5 is a schematic diagram of a color filter substrate according to another embodiment of the present disclosure.

Further, after fabricating the color resistance layer in the first pixel region through the inkjet printing process and fabricating the color resistance layer or the light-transmissive layer in the second pixel region through the exposure and development process, as shown in FIG. 5, the fabricating method further includes:

forming a planarization layer; and forming a mesh-like second black matrix pattern 5 on the planarization layer, where a plurality of sub-pixel regions are defined by the second black matrix pattern 5, which may avoid the light mixing between the adjacent sub-pixel regions, or forming a strip-like second black matrix pattern 5 on the planarization layer, where the second black matrix pattern 5 extends in a second direction perpendicular to the first direction, and a plurality of sub-pixel regions are defined by the first black matrix pattern and the second black matrix pattern, which may avoid the light mixing between the adjacent sub-pixel regions.

Figure 6:
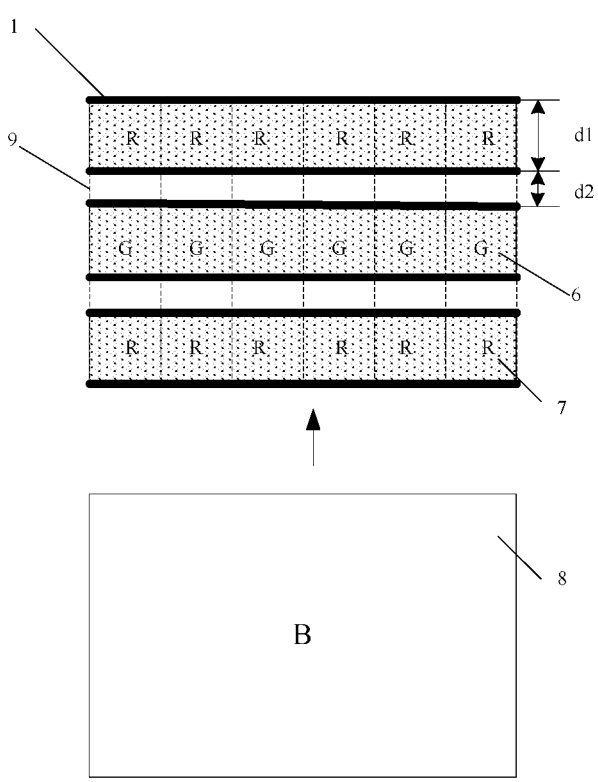
FIG. 6 is a schematic diagram of a display device according to an embodiment of the present disclosure.

Further, in the embodiments as shown in FIGS. 2 to 4, when the red color resistance layer 2, and the green color resistance layer 4 are made of a quantum dot material, and the backlight source of the corresponding display device is a blue backlight source, the blue color resistance layer may not be arranged in the region corresponding to the blue sub-pixel, only the light-transmissive layer is arranged, and the light emitted by the blue backlight source directly passes through the light-transmissive layer and the light emitted from the light-transmissive layer is the blue light. As shown in FIG. 6, a green quantum dot layer 6 and a red quantum dot layer 7 arranged alternately are formed in the first pixel region through the inkjet printing process, and a light-transmissive layer 9 is formed in the second pixel region through the exposure and development process. In such a manner, the blue light emits when the light emitted by a blue backlight source 8 of the display device passes through the light-transmissive layer 9, the green emits when the light emitted by the blue backlight source 8 of the display device passes through the green quantum dot layer 6, and the red light emits when the light emitted by the blue backlight source 8 of the display device passes through the red quantum dot layer 7. As a result, the color display is achieved.

Optionally, a green quantum dot layer 6 and a red quantum dot layer 7 arranged alternately may also be formed in the first pixel region through the inkjet printing process, and a blue quantum dot layer is formed in the second pixel region through the exposure and development process. In such a manner, the blue light emits when the light emitted by the blue backlight source 8 of the display device passes through the blue quantum dot layer, the green emits when the light emitted by the blue backlight source 8 of the display device passes through the green quantum dot layer 6, and the red light emits when the light emitted by the blue backlight source 8 of the display device passes through the red quantum dot layer 7. As a result, the color display is achieved.

Figure 7:
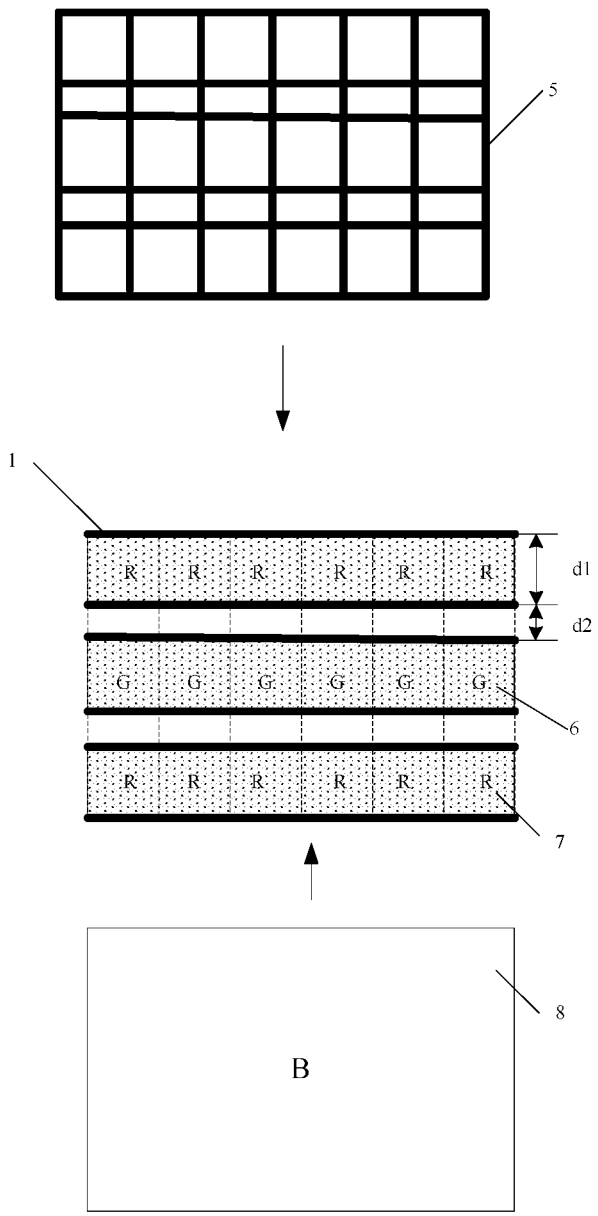
FIG. 7 is a schematic diagram of a display device according to another embodiment of the present disclosure.
Figure 8:
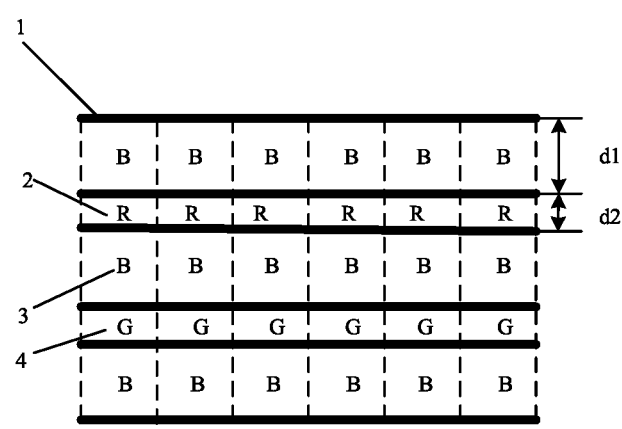
FIG. 8 is a schematic diagram of a color filter substrate according to an embodiment of the present disclosure.

On the basis of the above embodiments, as shown in FIG. 7, the fabricating method further includes:

forming a planarization layer; and forming a mesh-like second black matrix pattern 5 on the planarization layer, where a plurality of sub-pixel regions are defined by the second black matrix pattern 5, which avoids the light mixing between the adjacent sub-pixel regions, or forming a strip-like second black matrix pattern 5 on the planarization layer, where the second black matrix pattern extends in a second direction perpendicular to the first direction, and a plurality of sub-pixel regions are defined by the first black matrix pattern and the second black matrix pattern, which avoids the light mixing between the adjacent sub-pixel regions.

An embodiment of the present disclosure further provides a color filter substrate as shown in FIG. 1. The color filter substrate includes: a base substrate; and a strip-like first black matrix pattern 1 on the base substrate, where a first pixel region (A1 and A3) and a second pixel region (A2) arranged alternately in a first direction are defined by the first black matrix pattern 1, the first direction is perpendicular to an extending direction of the first black matrix pattern, a first width d1 of the first pixel region in the first direction is larger than a second width d2 of the second pixel region in the first direction, a color resistance layer or a light-transmissive layer is arranged in the first pixel region, and a color resistance layer or a light-transmissive layer is arranged in the second pixel region.

In the embodiment, two kinds of pixel regions with different widths are formed on the color filter substrate, and the two kinds of pixel regions with different widths are alternately arranged on the color filter substrate. The color resistance layer is fabricated in the wide pixel region through the inkjet printing process, which may reduce the precision requirement of the inkjet printing method applied to fabricate the color resistance layer, improve reliability of a color-film substrate product, enable the inkjet printing method to be applied to more kinds of color filter substrate products with different sizes, and take advantages of the inkjet printing method, such as the low cost, simple process and high color resistance utilization. In addition, the color resistance layer or the light-transmissive layer is fabricated through the exposure and development process in the narrow pixel region. Since the narrow pixel region and the wide pixel region are alternately arranged on the color filter substrate, and the adjacent narrow pixel regions is provided with the wide pixel region, it is able to prevent an offset or an angle offset from forming between the color resistance layer or the light-transmissive layer fabricated through the exposure and development process, to avoid adverse effects, and to ensure display effect of the display device.

As shown in Figures, d1 may be twice of d2, or larger than twice of d2. In such a manner, the first pixel region is wider, which may reduce the precision requirement of the inkjet printing method applied to fabricate the color resistance layer.

When the light-transmissive layer is formed in the first pixel region or the second pixel region, a backlight source of the corresponding display device is a monochromatic backlight source. In such a manner, the monochromatic light emitted by the monochromatic backlight source may be emitted directly through the light-transmissive layer and be involved in the color display.

Specifically, first color sub-pixels, second color sub-pixels and third color sub-pixels are formed on the color filter substrate, and the first color, the second color and the third color are capable of mixing into a white color. The second color sub-pixels are located in the second pixel region, and the first color sub-pixels and the third color sub-pixels are arranged alternately in the first direction in the first pixel region. In such a manner, the first color sub-pixels, the second color sub-pixels and the third color sub-pixels are alternately arranged, so as to achieve the color display. Optionally, the second color sub-pixels are located in the first pixel region, and the first color sub-pixels and the third color sub-pixels are arranged alternately in the first direction in the second pixel region.

In a specific embodiment, as shown in FIG. 2, a red color resistance layer 2 and a green color resistance layer 4 are formed in the first pixel region through the inkjet printing process, which are alternately arranged; and a blue color resistance layer 3 is formed in the second pixel region through the exposure and development process. When the red color resistance layer 2, the green color resistance layer 4 and the blue color resistance layer 3 are made of a color filter material, the backlight source of the corresponding display device is a white backlight source. When the red color resistance layer 2, the green color resistance layer 4 and the blue color resistance layer 3 are made of a quantum dot material, the backlight source of the corresponding display device is a blue backlight source.

In another specific embodiment, as shown in FIG. 3, a blue color resistance layer 3 and a green color resistance layer 4 are formed in the first pixel region through the inkjet printing process, which are alternately arranged; and a red color resistance layer 2 is formed in the second pixel region through the exposure and development process. When the red color resistance layer 2, the green color resistance layer 4 and the blue color resistance layer 3 are made of a color filter material, the backlight source of the corresponding display device is a white backlight source. When the red color resistance layer 2, the green color resistance layer 4 and the blue color resistance layer 3 are made of a quantum dot material, the backlight source of the corresponding display device is a blue backlight source.

In another specific embodiment, as shown in FIG. 4, a blue color resistance layer 3 and a red color resistance layer 2 are formed in the first pixel region through the inkjet printing process, which are alternately arranged; and a green color resistance layer 4 is formed in the second pixel region through the exposure and development process. When the red color resistance layer 2, the green color resistance layer 4 and the blue color resistance layer 3 are made of a color filter material, the backlight source of the corresponding display device is a white backlight source. When the red color resistance layer 2, the green color resistance layer 4 and the blue color resistance layer 3 are made of a quantum dot material, the backlight source of the corresponding display device is a blue backlight source.

As shown in FIG. 5, the color filter substrate further includes: a planarization layer covering the color resistance layer or the light-transmissive layer; and a mesh-like second black matrix pattern 5 on the planarization layer, where a plurality of sub-pixel regions are defined by the second black matrix pattern 5, which may the light mixing between the adjacent sub-pixel regions.

Alternatively, the second black matrix pattern may also be designed to be strip-like, the second black matrix pattern extends in a second direction perpendicular to the first direction, and a plurality of sub-pixel regions are defined by the first black matrix pattern and the second black matrix pattern, which avoids the light mixing between the adjacent sub-pixel regions.

Further, in the embodiments as shown in FIGS. 2 to 4, when the red color resistance layer 2 and the green color resistance layer 4 are made of a quantum dot material, and the backlight source of the corresponding display device is a blue backlight source, the blue color resistance layer may not be arranged in the region corresponding to the blue sub-pixel, only the light-transmissive layer is arranged, and the light emitted by the blue backlight source directly passes through the light-transmissive layer and the blue light emits. As shown in FIG. 6, a green quantum dot layer 6 and a red quantum dot layer 7 arranged alternately are formed in the first pixel region through the inkjet printing process, and a light-transmissive layer 9 is formed in the second pixel region through the exposure and development process. In such a manner, the blue light emits when the light emitted by a blue backlight source 8 of the display device passes through the light-transmissive layer 9, the green emits when the light emitted by the blue backlight source 8 of the display device passes through the green quantum dot layer 6, and the red light emits when the light emitted by the blue backlight source 8 of the display device passes through the red quantum dot layer 7. As a result, the color display is achieved.

Optionally, a green quantum dot layer 6 and a red quantum dot layer 7 arranged alternately may also be formed in the first pixel region through the inkjet printing process, and a blue quantum dot layer is formed in the second pixel region through the exposure and development process. In such a manner, the blue light emits when the light emitted by the blue backlight source 8 of the display device passes through the blue quantum dot layer, the green emits when the light emitted by the blue backlight source 8 of the display device passes through the green quantum dot layer 6, and the red light emits when the light emitted by the blue backlight source 8 of the display device passes through the red quantum dot layer 7. As a result, the color display is achieved.

On the basis of the above embodiments, as shown in FIG. 7, the color filter substrate further includes: a planarization layer covering the color resistance layer or the light-transmissive layer; and a mesh-like second black matrix pattern 5 on the planarization layer, where a plurality of sub-pixel regions are defined by the second black matrix pattern 5, which may the light mixing between the adjacent sub-pixel regions.

Alternatively, the second black matrix pattern may also be designed to be strip-like, the second black matrix pattern extends in a second direction perpendicular to the first direction, and a plurality of sub-pixel regions are defined by the first black matrix pattern and the second black matrix pattern, which avoids the light mixing between the adjacent sub-pixel regions.

A display panel is further provided according to an embodiment of the present disclosure, which includes the above color filter substrate.

A display device is further provided according to an embodiment of the present disclosure, which includes the above display panel and a backlight source located at a light-emitting side of the display panel. The display device may include any product or component having a display function, such as a liquid crystal television, a liquid crystal display, a digital photo frame, a cell phone, a tablet computer. The display device further includes a flexible circuit board, a printed circuit board and a back plate. Connection manners and arrangements of various components such as the flexible circuit board, the printed circuit board and the back plate inside the display device belong to the common technology in the related art, and thus these will not be repeated herein.

When the light-transmissive layer is formed in the first pixel region or the second pixel region, a backlight source of the corresponding display device is a monochromatic backlight source. In such a manner, the monochromatic light emitted by the monochromatic backlight source may be emitted directly through the light-transmissive layer and be involved in the color display.

In a specific embodiment, as shown in FIGS. 6 and 7, the color filter substrate includes a plurality of blue sub-pixels, a plurality of red sub-pixels and a plurality of green sub-pixels, each of the blue sub-pixels includes a light-transmissive layer 9 in the second pixel region, each of the red sub-pixels includes a red quantum dot layer 7 in the first pixel region, each of the green sub-pixels includes green quantum dot layer 6 in the first pixel region, and the backlight source of the display device is a blue backlight source 8.

Optionally, the color filter substrate includes a plurality of blue sub-pixels, a plurality of red sub-pixels and a plurality of green sub-pixels, each of the blue sub-pixels includes a blue quantum dot layer in the second pixel region, each of the red sub-pixels includes a red quantum dot layer in the first pixel region, each of the green sub-pixels includes a green quantum dot layer in the first pixel region, and the backlight source of the display device is a blue backlight source 8.

Unless otherwise defined, technical terms or scientific terms used in the present disclosure should be interpreted according to common meanings thereof as commonly understood by those of ordinary skills in the art. Such terms as "first", "second" and the like used in the present disclosure do not represent any order, quantity or importance, but are merely used to distinguish different components. Such terms as "including", "includes", "include", "comprise", "comprises" or "comprising" and the like mean that an element or an article preceding the term contains elements or items and equivalents thereof behind the term, but does not exclude other elements or items. Such terms as "connect", "connected" or "connecting" and the like are not limited to physical or mechanical connections, but may include electrical connections, whether direct connection or indirect connection. Such terms as "on", "under", "left", "right" and the like are only used to represent a relative position relationship, and when an absolute position of a described object is changed, the relative position relationship thereof may also be changed accordingly.

It may be understood that when an element such as a layer, a film, a region or a substrate is referred to as being "on" or "under" another element, the element may be "directly" "on" or "under" the another element, or there may exist an intervening element.

The above embodiments are merely optional embodiments of the present disclosure. It should be noted that numerous improvements and modifications may be made by those skilled in the art without departing from the principle of the present disclosure, and these improvements and modifications shall also fall within the scope of the present disclosure.

What is claimed is:

1. A method for fabricating a color filter substrate, comprising:
    forming a strip-like first black matrix pattern on a base substrate of the color filter substrate, wherein the strip-like first black matrix pattern defines multiple first pixel regions and multiple second pixel regions alternately arranged in a first direction, the first direction is perpendicular to an extending direction of the first black matrix pattern, and a first width of each first pixel region in the first direction is larger than a second width of each second pixel region in the first direction;
    fabricating a color resistance layer in each first pixel region through an inkjet printing process;
    fabricating a color resistance layer in each second pixel region through an exposure and development process;
    wherein first color sub-pixels, second color sub-pixels and third color sub-pixels are formed on the color filter substrate, a first color, a second color and a third color are capable of mixing into a white color, and the method further comprises:
    fabricating the color resistance layer in each second pixel region with the first color sub-pixels or the third color sub-pixels so that the first color sub-pixels and the third color sub-pixels are alternately arranged in the first direction, wherein each second pixel region is a strip-like region parallel to the extending direction of the first black matrix pattern, each strip-like region comprises the color resistance layer of a plurality of the first color sub-pixels, or each strip-like region comprises the color resistance layer of a plurality of the third color sub-pixels; and
    fabricating the color resistance layer in each first pixel region with the second color sub-pixels, wherein each first pixel region is a strip-like region parallel to the extending direction of the first black matrix pattern, and comprises the color resistance layer of a plurality of the second color sub-pixels;
    wherein the fabricating the color resistance layer in each first pixel region through the inkjet printing process comprises:
    spraying a color resistance material in each first pixel region through the inkjet printing process to fabricate the color resistance layer, the color resistance material comprising at least one of a color filter material, a fluorescent material or a quantum dot material.

2. The method according to claim 1, wherein the second color sub-pixels are blue sub-pixels, the first color sub-pixels are red sub-pixels, the third color sub-pixels are green sub-pixels, wherein the second color sub-pixels include a light-transmissive layer in the first pixel region, the first color sub-pixels include a red quantum dot layer in the second pixel region, and the third color sub-pixels include a green quantum dot layer in the second pixel region, and wherein the method further comprises:
    fabricating the color resistance layer in each second pixel region with the red quantum dot layer or the green quantum dot layer so that the red quantum dot layer and the green quantum dot layer are alternately arranged in the first direction; and
    fabricating the light-transmissive layer corresponding to the second color sub-pixel in each first pixel region.

3. The method according to claim 1, after fabricating the color resistance layer in each first pixel region through the inkjet printing process and fabricating the color resistance layer in each second pixel region through the exposure and development process, the method further comprising:
    forming a planarization layer; and
    forming a mesh-like second black matrix pattern on the planarization layer, wherein the plurality of sub-pixel regions are defined by the mesh-like second black matrix pattern.

4. The method according to claim 1, after fabricating the color resistance layer in each second pixel region through the exposure and development process, further comprising:
    forming a planarization layer; and
    forming a strip-like second black matrix pattern on the planarization layer, wherein the second black matrix pattern extends in a second direction perpendicular to the first direction, and the plurality of sub-pixel regions are defined by the first black matrix pattern and the second black matrix pattern.

5. The method according to claim 1, wherein the first width is twice of the second width.

6. The method according to claim 1, wherein the first width is larger than twice of the second width.

7. A color filter substrate, comprising:
    a base substrate; and
    a strip-like first black matrix pattern on the base substrate, wherein a first pixel region and a second pixel region arranged alternately in a first direction are defined by the first black matrix pattern, the first direction is perpendicular to an extending direction of the first black matrix pattern, a first width of the first pixel region in the first direction is larger than a second width of the second pixel region in the first direction, a color resistance layer is arranged in the first pixel region and fabricated through an inkjet printing process, and a color resistance layer is arranged in the second pixel region and fabricated through an exposure and development process, the color resistance material comprising at least one of a color filter material, a fluorescent material or a quantum dot material;

first color sub-pixels, second color sub-pixels and third color sub-pixels are formed on the color filter substrate, wherein a first color, a second color and a third color are capable of mixing into a white color, the second color sub-pixels are arranged in the first pixel region, and the first color sub-pixels and the third color sub-pixels are arranged alternately in the first direction in the second pixel region;

the second pixel region is a strip-like region parallel to the extending direction of the first black matrix pattern, the strip-like region comprises the color resistance layer of a plurality of the first color sub-pixels, or the strip-like region comprises the color resistance layer of a plurality of the third color sub-pixels; and the first pixel region is a strip-like region parallel to the extending direction of the first black matrix pattern, and comprises the color resistance layer of a plurality of the second color sub-pixels.

8. The color filter substrate according to claim 7, wherein the first width is larger than twice of the second width.

9. The color filter substrate according to claim 7, wherein the second color sub-pixels are blue sub-pixels, the first color sub-pixels are red sub-pixels, the third color sub-pixels are green sub-pixels, wherein the second color sub-pixels includes a light-transmissive layer or a blue quantum dot layer in the second pixel region, the first color sub-pixels includes a red quantum dot layer in the first pixel region, and the third color sub-pixels includes a green quantum dot layer in the first pixel region.

10. The color filter substrate according to claim 7, further comprising:
   a planarization layer covering the color resistance layer or the light-transmissive layer; and
   a mesh-like second black matrix pattern on the planarization layer, wherein a plurality of sub-pixel regions are defined by the second black matrix pattern.

11. The color filter substrate according to claim 7, further comprising:
   a planarization layer covering the color resistance layer or the light-transmissive layer; and
   a strip-like second black matrix pattern on the planarization layer, wherein the second black matrix pattern extends in a second direction perpendicular to the first direction, and a plurality of sub-pixel regions are defined by the first black matrix pattern and the second black matrix pattern.

12. A display panel, comprising: the color filter substrate according to claim 7 and an array substrate.

13. A display device, comprising:
   a display panel; and
   a backlight source located at a light-emitting side of the display panel,
   wherein the display panel comprises a color filter substrate and an array substrate, and the color filter substrate comprises: a base substrate; and a strip-like first black matrix pattern on the base substrate,
   wherein a first pixel region and a second pixel region arranged alternately in a first direction are defined by the first black matrix pattern, the first direction is perpendicular to an extending direction of the first black matrix pattern, a first width of the first pixel region in the first direction is larger than a second width of the second pixel region in the first direction, a color resistance layer is arranged in the first pixel region and fabricated through an inkjet printing process, and a color resistance layer is arranged in the second pixel region and fabricated through an exposure and development process, the color resistance material comprising at least one of a color filter material, a fluorescent material or a quantum dot material;
   first color sub-pixels, second color sub-pixels and third color sub-pixels are formed on the color filter substrate, wherein a first color, a second color and a third color are capable of mixing into a white color, the second color sub-pixels are arranged in the first pixel region, and the first color sub-pixels and the third color sub-pixels are arranged alternately in the first direction in the second pixel region;
   the second pixel region is a strip-like region parallel to the extending direction of the first black matrix pattern, the strip-like region comprises the color resistance layer of a plurality of the first color sub-pixels, or the strip-like region comprises the color resistance layer of a plurality of the third color sub-pixels; and the first pixel region is a strip-like region parallel to the extending direction of the first black matrix pattern, and comprises the color resistance layer of a plurality of the second color sub-pixels.

14. The display device according to claim 13, wherein the backlight source is a monochromatic backlight source in a case that a light-transmissive layer is arranged in the first pixel region or the second pixel region.

* * * * *